(12) United States Patent
Schäfer

(10) Patent No.: US 12,320,867 B2
(45) Date of Patent: Jun. 3, 2025

(54) SENSOR WITH ADJUSTABLE DIGITAL OUTPUT SIGNAL RESOLUTION

(71) Applicant: Allegro MicroSystems, LLC, Manchester, NH (US)

(72) Inventor: Sebastian Schäfer, St Leon Rot (DE)

(73) Assignee: Allegro MicroSystems, LLC, Manchester, NH (US)

( * ) Notice: Subject to any disclaimer, the term of this patent is extended or adjusted under 35 U.S.C. 154(b) by 171 days.

(21) Appl. No.: 18/457,413

(22) Filed: Aug. 29, 2023

(65) Prior Publication Data

US 2025/0076415 A1  Mar. 6, 2025

(51) Int. Cl.
*G01R 33/00* (2006.01)
*G01R 33/07* (2006.01)

(52) U.S. Cl.
CPC ......... *G01R 33/0029* (2013.01); *G01R 33/07* (2013.01)

(58) Field of Classification Search
CPC .............. G01R 33/0029; G01R 33/07; G01R 33/0017; G01R 33/0035; G01R 33/0041; G01R 33/077; G01R 33/072; G01R 33/075; G01R 33/066; G01R 33/09; G01R 33/091; G01R 33/093; G01R 33/095; G01R 33/096; G01R 33/098
See application file for complete search history.

(56) References Cited

U.S. PATENT DOCUMENTS

| | | | |
|---|---|---|---|
| 9,797,746 B2 | 10/2017 | Vuillermet et al. | |
| 2014/0285189 A1* | 9/2014 | Kashmiri | G01R 33/04 324/253 |
| 2018/0224484 A1* | 8/2018 | Raman | G01R 27/14 |
| 2020/0103474 A1* | 4/2020 | Foletto | G01R 33/0029 |
| 2020/0233028 A1* | 7/2020 | Forrest | G01R 31/2829 |
| 2021/0215775 A1* | 7/2021 | Kulla | G01R 33/0017 |

OTHER PUBLICATIONS

U.S. Appl. No. 18/450,494, filed Aug. 16, 2023, Hein et al.
Infineon Datasheet "XMC4100 / XMC4200 V1.5, Microcontroller Series for Industrial Applications" Apr. 2023, 91 pages.

* cited by examiner

*Primary Examiner* — Alvaro E Fortich
(74) *Attorney, Agent, or Firm* — DALY, CROWLEY, MOFFORD & DURKEE, LLP

(57) ABSTRACT

A sensor integrated circuit includes a sensing element configured to generate a sensor output signal proportional to a sensed parameter, a front-end amplifier coupled to receive the sensor output signal and configured to generate an amplifier output signal, and a sigma-delta modulator coupled to receive the amplifier output signal and configured to generate a digital sensor output signal indicative of the sensed parameter. At least one of the front-end amplifier or the sigma-delta modulator has an adjustable setting configured to change a resolution of the digital sensor output signal.

21 Claims, 4 Drawing Sheets

SENSOR WITH ADJUSTABLE DIGITAL OUTPUT SIGNAL RESOLUTION

BACKGROUND

As is known, sensors are used to perform various functions in a variety of applications. Some sensors include one or magnetic field sensing elements, such as a Hall effect element or a magnetoresistance element, to sense a magnetic field associated with a target object. Magnetic field sensor applications can include, but are not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a linear magnetic field sensor that senses a magnetic field strength or density of a magnetic field.

The sensor output signal can be provided in various formats. For example, some sensors communicate with an external controller over a two-wire, digital, current level protocol with which the power connections to the sensor are used to communicate data by applying discrete current levels to the power connections. Other sensors communicate with an external controller through a three-wire interface in which a dedicated connection is provided to communicate data as an analog voltage level that can be proportional to the sensed parameter.

In some systems, the sensor is located at a relatively long distance from the external controller. Depending on the length of the connection and external factors, analog voltage signals can be more susceptible to noise pick-up than digital signals, which can lead to a preference for digital signals, particularly in safety critical applications.

Requirements for the speed and resolution of sensor output data can vary based on the application. For example, some sensor applications have strict speed requirements, particularly in safety critical applications, but are more lenient on the resolution requirement while other applications can tolerate slower output speed but require high resolution.

SUMMARY

The present disclosure includes circuits and methods for providing a digital sensor output signal with an adjustable resolution. Methodologies include adjusting settings associated with a front-end amplifier and/or with a modulator of the sensor. The resolution selection can be initiated by the sensor, microcontroller, and/or a user and is communicated between the sensor and microcontroller. The described arrangements permit customization of the sensor and microcontroller to suit application signal speed and resolution requirements.

According to the disclosure, a sensor integrated circuit configured to generate a digital sensor output signal indicative of a sensed parameter includes a sensing element configured to generate a sensor output signal proportional to the sensed parameter, a front-end amplifier coupled to receive the sensor output signal and configured to generate an amplifier output signal, and a sigma-delta modulator coupled to receive the amplifier output signal and configured to generate the digital sensor output signal, wherein at least one of the front-end amplifier or the sigma-delta modulator has an adjustable setting configured to change a resolution of the digital sensor output signal.

Features may include one or more of the following individually or in combination with other features. The front-end amplifier can have an adjustable gain configured to change the resolution of the digital sensor output signal. The sigma-delta modulator can include an integrator configured to receive the amplifier output signal and generate an integrated signal, a comparator having a first input coupled to receive the integrated signal, a second input coupled to receive a threshold signal, and an output at which a comparator output signal is provided, a flip-flop configured to receive the comparator output signal and generate pulses and a feedback signal for coupling to the integrator, a clock configured to generate a clock signal to control the flip-flop, and a counter configured to count the pulses over a predetermined time period and generate the digital sensor output signal as a pulse stream having a frequency proportional to the sensed parameter. The threshold signal can be adjustable to change the resolution of the digital sensor output signal. Decreasing the threshold signal can correspond to a first dynamic range of the sensed parameter and increasing the threshold signal can correspond to a second dynamic range of the sensed parameter, wherein the first dynamic range is less than the second dynamic range. The adjustable setting is controlled based on a level of the clock signal. The sensor integrated circuit can further include an input configured to receive an input signal to control the adjustable setting. The adjustable setting can be controlled based on the sensing element output signal reaching a predetermined signal level. The digital sensor output signal can be coupled to an external controller. The external controller can include a demodulator responsive to the adjustable setting. The sensing element can include a magnetic field sensing element and the sensed parameter is a magnetic field.

Also described is a method for generating a digital sensor output signal of a sensor integrated circuit, including sensing a parameter with a sensing element to generate a sensing element output signal proportional to the sensed parameter, amplifying the sensing element output signal with a gain to generate an amplified signal, converting the amplified signal into the digital sensor output signal with a sigma-delta modulator responsive to a threshold signal, and changing a resolution of the digital sensor output signal by adjusting at least one of the gain or the threshold signal.

Features may include one or more of the following individually or in combination with other features. Converting the amplified signal into the digital sensor output signal with the sigma-delta modulator can include integrating the amplified signal to generate an integrated signal, comparing the integrated signal to the threshold signal to generate a comparator output signal, receiving the comparator output signal and a clock signal with a flip-flop configured to generate pulses and a feedback signal for coupling to the integrator, and counting the pulses over a predetermined time period to generate the digital sensor output signal as a pulse stream having a frequency proportional to the sensed parameter. Decreasing the threshold signal can correspond to a first dynamic range of the sensed parameter and increasing the threshold signal corresponds to a second dynamic range of the sensed parameter, wherein the first dynamic range is less than the second dynamic range. Changing the resolution can include determining a level of the clock signal. Changing the resolution can include receiving an input signal to adjust the gain or the threshold signal. Adjusting the gain or the threshold signal can be controlled based on the sensing element output signal reaching a predetermined signal level. The method can further include coupling the digital sensor output signal to an external controller. The method can further include demodulating the digital sensor output signal with the external controller based on the gain or the threshold signal. Demodulating the digital sensor output signal can include one or more of scaling a number of clock cycles for integration, changing an order of a filter. Sensing the parameter with a sensing element can include sensing a magnetic field with a magnetic field sensing element.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
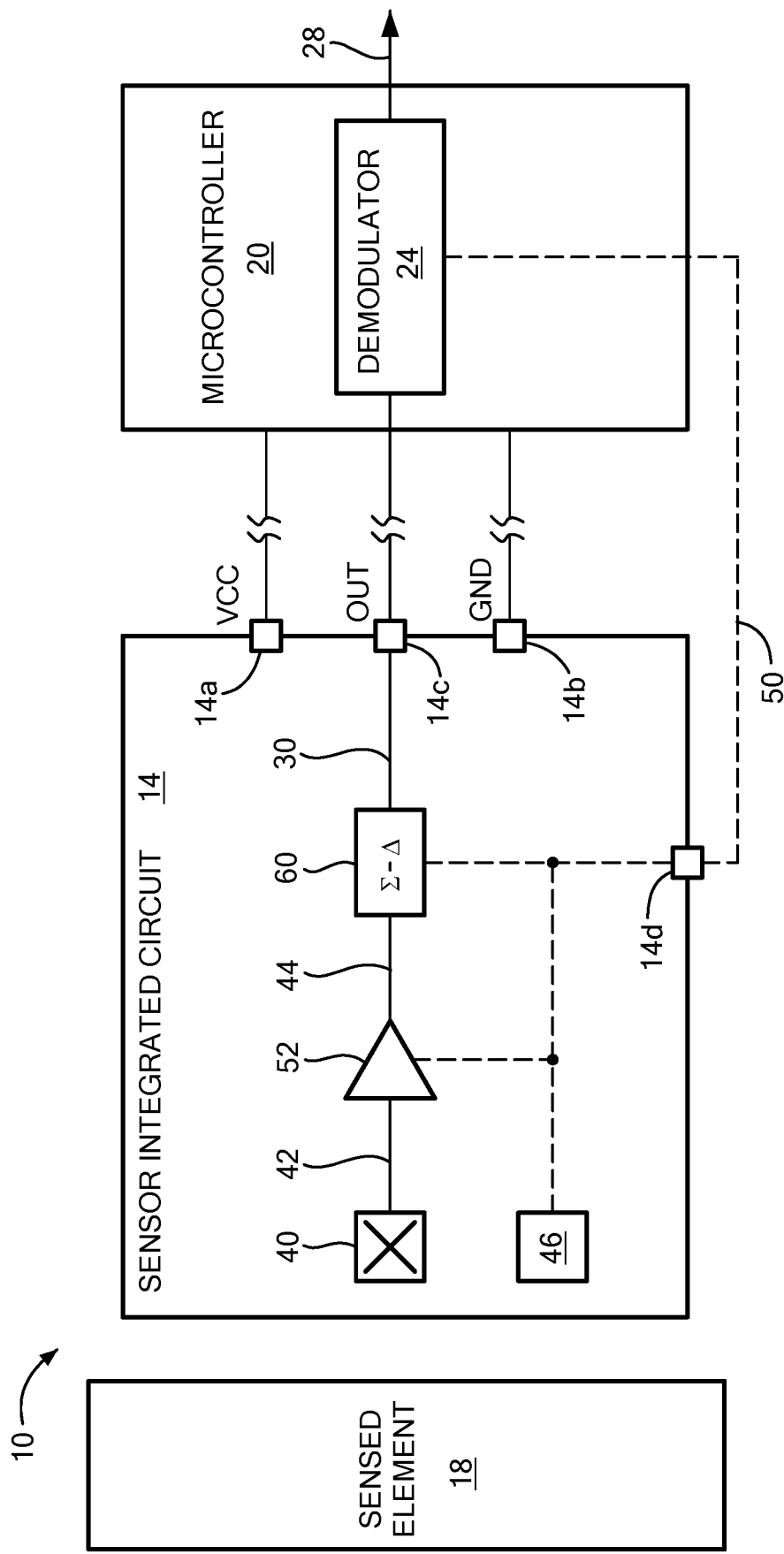
FIG. 1 is a block diagram of a sensor system including a sensor integrated circuit having a modulator and a microcontroller having a demodulator according to the disclosure.

Referring to FIG. 1, a sensor system 10 includes a sensor integrated circuit (IC) 14 configured to generate a digital sensor output signal 30 indicative of a sensed parameter associated with a target object, or element 18. A sensing circuit 40 generates a sensing element output signal 42 that is proportional to the sensed parameter associated with element 18. The sensor 14 includes a power connection 14a to receive a supply voltage VCC, a ground connection 14b, and an output connection OUT 14c at which the digital sensor output signal 30 is provided.

A microcontroller 20 is coupled to receive the digital sensor output signal 30 and can demodulate the digital sensor output signal 30 with a demodulator 24 to convert the signal to an analog voltage 28 for further processing. Sensor 14 and microcontroller 20 can share power and ground connections and are coupled together through an additional signal line 50 to coordinate a resolution selection in order to ensure accurate demodulation, as will be described.

Sensing circuit 40 can take various forms. In example embodiments, the sensor 14 can be a magnetic field sensor and the sensing circuit 40 can include one or more magnetic field sensing elements. Other types of sensing circuits 40 are possible, such as can include one or more optical sensing elements, pressure sensing elements, or temperature sensing elements, as non-limiting examples.

The parameter associated with element 18 that is sensed by sensing circuit 40 can be various parameters depending on element 18 and application. For example, the sensed parameter can be a current through a current conductor element 18 in the case of a current sensor IC 14 or a magnetic field strength associated with a ferromagnetic or permanent magnet target 18 in the case of a linear sensor, as non-limiting examples. It will be appreciated by those of ordinary skill in the art that other parameters associated with element 18 are possible.

A front-end amplifier 52 is coupled to receive the sensing element output signal 42 and configured to generate an amplified signal 44. An analog-to-digital converter (ADC) in the form of a sigma-delta modulator 60 is coupled to receive the amplified signal 44 and configured to generate the digital sensor output signal 30. It will be appreciated by those of ordinary skill in the art that the sensor IC 14 can include additional processing circuitry depending on the application.

According to the disclosure, at least one of the front-end amplifier 52 or the sigma-delta modulator 60 has an adjustable setting configured to select a resolution of the digital sensor output signal 30. A higher resolution digital output signal 30 contains a denser bit stream (i.e., a "zooming in" of the signal) than a lower resolution digital output signal.

With this arrangement, challenges otherwise associated with providing digital sensor output signals can be alleviated in that the resolution of the sensor output signal 30 can be tailored to meet the particular application requirements. For example, often conventional microcontrollers can only achieve demodulation rates of up to about 64 MHz. Such demodulation rates would only allow for less than six-bit resolution for a 1 MHz sensor output signal or for twelve-bit resolution for a signal speed of less than 15 kHz. Thus, depending on the application requirements, conventional sensors can transmit either low resolution data or low speed data. For example, certain applications, such as automotive current sensors do not permit signal speeds as slow as 15 kHz, thereby requiring the sensor output data to be lower resolution and higher speed. Further, in some applications, only speed or resolution requirements (but not both requirements) are strict over the full dynamic range of the sensor. In some applications high speed data is strict over the entire dynamic input range, but resolution requirements are not. As an example, in a sensor having a 100 Gauss full signal range (FSR), resolution requirements for lower field strengths may be on the order of 0.1 Gauss, whereas resolution requirements for higher field strengths may be on the order of 1 Gauss or 10 Gauss. According to the disclosure, the described resolution selection arrangements permit selection of sensor output data resolution in order to meet application requirements without requiring different sensors to be provided for different applications.

Sensor integrated circuit 14 includes a connection 14d through which selection of the output signal resolution can be made and/or communicated with the microcontroller 20 by resolution selection signal 50 with which the adjustable setting can be changed. Signal 50 is coupled to one or both of the amplifier 52 and the sigma-delta modulator 60, depending on the mechanism implemented for resolution selection.

In the case of the front-end amplifier 52 being adjustable to adjust the resolution of the sensor output signal 30, a gain of the amplifier 52 can be changed by control of signal 50. For example, the amplifier 52 can include a resistive feedback network including one or more switches with which the amplification gain can be selected by opening and closing the switches.

In the case of modulator 60 being adjustable to adjust the resolution of the sensor output signal 30, a threshold associated with the modulator can be changed by control of signal 50 as is explained below in connection with an example sigma-delta modulator 60 shown in FIG. 2.

Various schemes are possible for initiating resolution selection. Resolution selection can be initiated by the IC 14, externally, and/or by the microcontroller 20. For example, resolution selection can be user programmable in response to a user-generated input signal 50 received at input connection 14*d*.

Alternatively, resolution selection can be initiated on the sensor IC 14 in response to sensed conditions, such as conditions associated with the sensed parameter or with the output of the modulator 60. Initiating resolution selection by the sensor 14 based on sensor detected conditions can eliminate the need for the sensor to receive an externally generated resolution selection, however a dedicated signal line between the sensor 14 and microcontroller 20 is still required in order to coordinate the resolution selection and optionally synchronize the timing of resolution adjustments.

For example, the adjustable setting by which resolution is selected can be controlled based on the sensing element output signal 42 reaching a predetermined signal level as detected by a comparator 46 within sensor 14. Hysteresis can be implemented in order to prevent the resolution range from changing based on the presence of noise.

As another example, the resolution setting can be based on a level of a clock (e.g., clock signal 74 of FIG. 2) signal as determined by comparator 46. For example, if the clock signal level is at VCC, a default modulator resolution range can be used and for clock signal level at VCC/2, a higher resolution range can be used.

Further, resolution selection can be initiated by microcontroller 20. In this scenario, the selection is communicated to the sensor IC 14, such as by signal 50, and the front-end amplifier 52 and/or modulator 60 operate to adjust the resolution accordingly on the clock cycle following receipt of the signal 50.

Synchronizing the timing of resolution setting changes by the sensor 14 with demodulation by the microcontroller 20 can eliminate delay and/or error in demodulation. For example, the input data to the integration and/or filter stage of the demodulator can be dynamically weighed during or shortly after the adjustment of the sensor range and resolution such that the change in bit-stream density is properly accounted for and the demodulator output is not delayed or erroneously perturbed.

Regardless of the mechanism by which resolution selection is made, the resolution selection is communicated between the sensor IC 14 and the microcontroller 20 in order to ensure accurate demodulation of the output signal 30. In other words, the modulator 60 and demodulator 24 need to be coordinated so that the demodulator 24 can operate based on the degree to which the digital output signal 30 is "zoomed in" or "zoomed out."

Regardless of the mechanism by which resolution selection is made, the selection can be a simple dual-range or encompass more than two ranges by using several selector lines (i.e., signal line 50 can be implemented with more than a single signal line and connection 14*d* can include more than one connection) or bits of information. For example, in the case of a dual-range selection, a user may be able to select between a first dynamic range of the sensed parameter and a second dynamic range that is a predetermined times greater than the first range, such as ten times greater, such that a first resolution selection can be at 100% of the full scale range and a second resolution selection can be at 10% of the full scale range.

Figure 2:
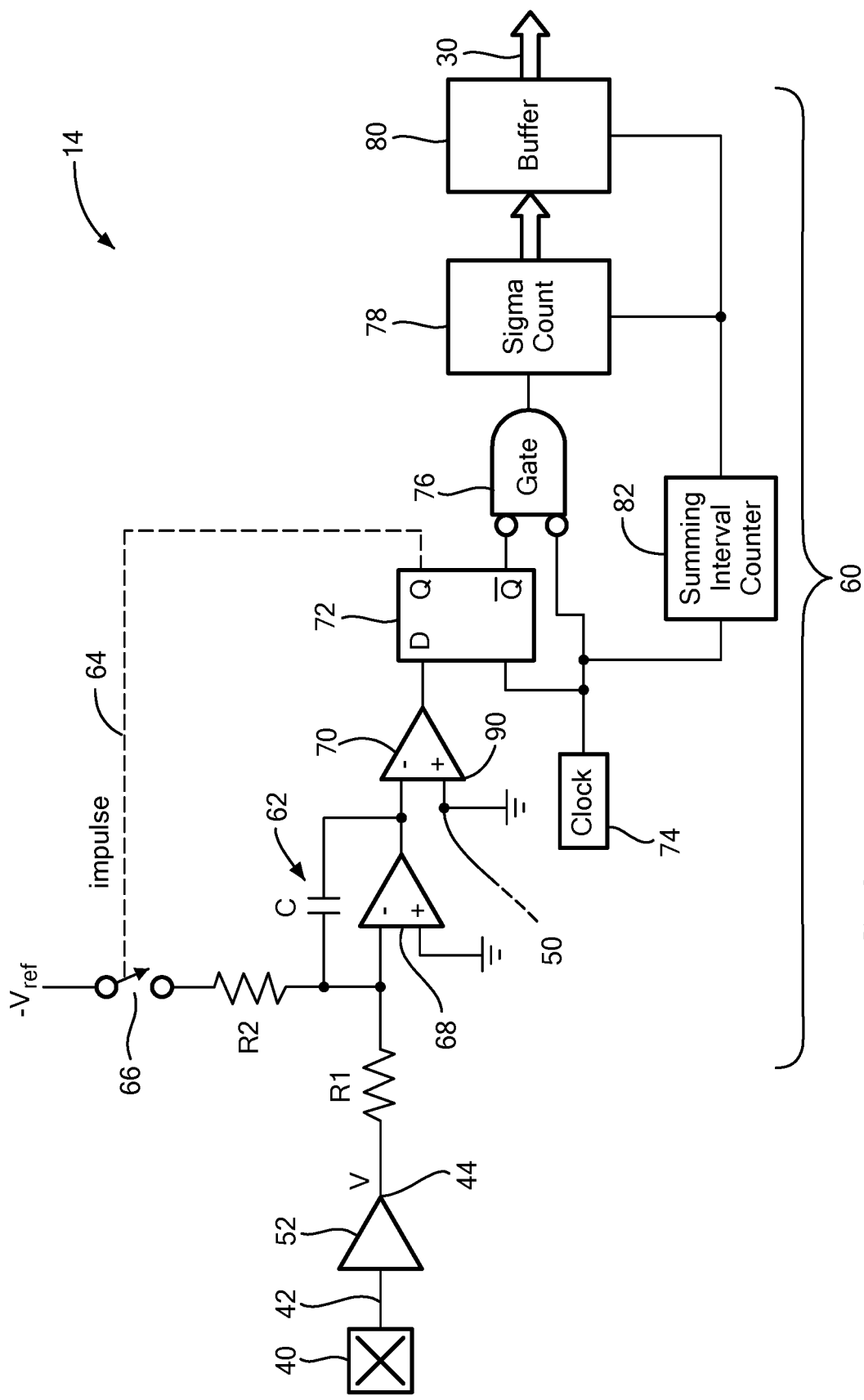
FIG. 2 shows the sensor integrated circuit of FIG. 1 including additional detail of an example modulator.

Referring also to FIG. 2, a portion of the sensor IC 14 is shown including sensing circuit 40, front-end amplifier 52, and sigma-delta modulator 60. Modulator 60 is coupled to receive the amplified output signal 44 and generate the digital, modulated sensor output signal 30.

More particularly, amplified output signal 44 is integrated by an integrator 62 including resistors R1, R2, capacitor C, and operational amplifier 68 at a rate established by an impulse feedback signal 64 through a switch 66, as shown. The impulse signal 64 is generated by a flip-flip 72. The current into the capacitor C is the sum of the impulse reference voltage Vref divided by R2 and the amplified signal 44 divided by R1. The change in voltage at the output of the amplifier 68 is equal to the change in its input voltage divided by the gain of amplifier 68. The amplifier gain is high such that the change in input voltage can be neglected so that the current into the capacitor C is substantially equal to the amplified signal 44 divided by the resistance R1.

The output of amplifier 68 is the integral of the current into the capacitor C. Stated differently, amplifier 70 generates a voltage that is the integral of the current into capacitor C divided by the capacitance of capacitor C.

A comparator 70 is configured to compare the integrator output to a threshold 90. In the illustrated embodiment, the threshold 90 at the non-inverting input of the comparator 70 is at ground. Thus, when the integrator output is less than the zero threshold 90, the comparator output goes high and remains high until the integrator output becomes greater than the zero threshold.

According to an aspect of the disclosure, the threshold 90 can be the adjustable setting by which resolution of the output signal 30 is adjusted. To this end, the resolutions selection signal 50 can be selectively coupled to the non-inverting input of comparator 70 to establish the threshold 90 for comparison to the integrator output, in which case non-inverting input is decoupled from ground.

Varying the threshold 90 varies the modulator density, or resolution for a given analog input signal 44. More particularly, decreasing the threshold signal 90 will increase the resolution and corresponds to a first, smaller dynamic range of the sensed parameter and increasing the threshold signal will decrease the resolution and corresponds to a second dynamic range of the sensed parameter that is larger than the first dynamic range.

Flip-flop 72 transfers the D input provided by the output of comparator 70 to the Q output to provide the impulse signal 64 upon the occurrence of a positive edge of a clock pulse provided by clock 74. The Q output of flip-flop 72 provides the impulse signal 64 that controls the switch 66 and thus, the current into the integrator 62.

A logic gate 76 is coupled to receive the clock signal and the inverted Q output of flip-flop 72 and provides a bit stream to a counter 78. Counter 78 generates a count signal having a value indicative of the number of pulses in the gate output signal for coupling to a buffer. A summing interval counter 82 controls the counter 78 and buffer 80 so that the buffer output is indicative of a pulse count within a predetermined time interval. In this way, the digital sensor output signal 30 is provided as a pulse stream having a pulse frequency proportional to the sensed parameter.

It will be appreciated by those of ordinary skill in the art that modulator 60 is an example modulator and that other modulator configurations can be suitable for use in the sensor IC 14.

Figure 3:
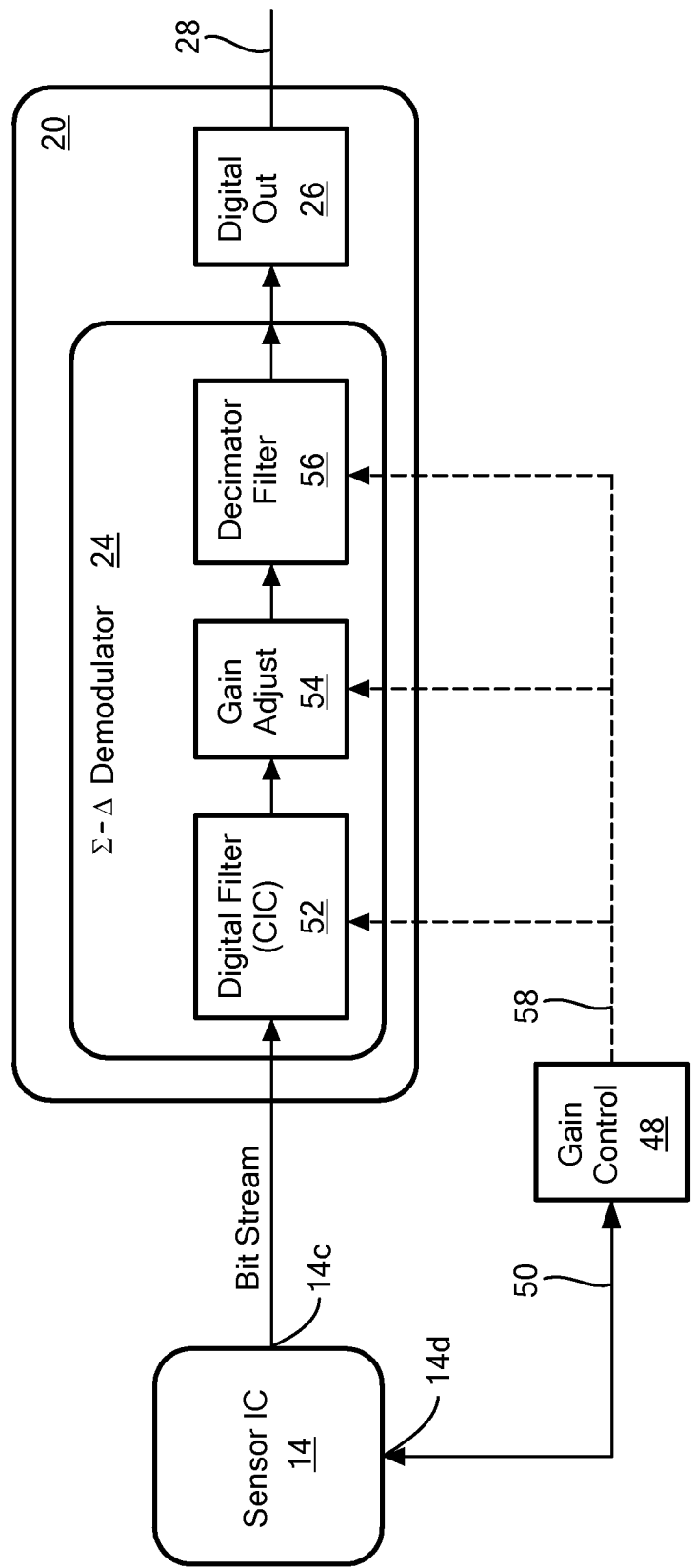
FIG. 3 shows the microcontroller of FIG. 1 including additional detail of the demodulator.

Referring also to FIG. 3, microcontroller 20 including demodulator 24 is shown in greater detail. Demodulator 24 can include a (decimating) low-pass filter 52 that can take the form of a Cascaded Integrator-Comb (CIC) filter. The decimation factor and number of stages of the filter 52 can be selected to prioritize either resolution or response time, depending on application requirements.

The output of filter 52 can be coupled to a gain adjust stage 54. Gain adjust stage 54 can take the form of, but not limited to, a multiplication stage for scaling of the data by the adjustable gain factor or a dedicated integrator that adjusts the gain by averaging over the data output of 52 and can be coupled to a gain control block 48, as shown.

Gain control block 48 can represent a signal conversion block or an interface for converting a user generated resolution selection signal 50 into a signal for coupling to demodulator 24 and can be internal or external to the microcontroller 20. For example, a user-generated resolution selection input signal 50 can be coupled to sensor 14 to control one of both of the sensor amplifier 52 or modulator 60 as explained above. The output of gain control block 48 can be a signal 58 by which the resolution selection is communicated to the microcontroller 20 and/or the sensor 14. It will be appreciated by those of ordinary skill in the art that gain control block 48 is optional and that its functionality can be achieved internally to the microcontroller 20 or through external mechanisms.

By operation and adjustment of any one or more of digital filter 52, gain adjust block 54, or decimation filter 56, the output of the demodulator 24 can be normalized according to the resolution selection. For example, when gain at the modulator 60 is increased (i.e., resulting in a smaller dynamic range, or higher bitstream density per given input signal), the output of the demodulator 24 can be normalized by a relatively high gain factor. Conversely, when gain at the modulator 60 is decreased (i.e., resulting in a larger dynamic range, or lower bitstream density per given input signal), normalization can be achieved with a lower gain factor introduced by gain adjust block 54.

An output of the gain adjust block 54 can be coupled to a further filter 56, which can be a decimator filter. It will be appreciated by those of ordinary skill in the art that gain can be adjusted in any of stages 52, 54, and/or 56. Thus, having a dedicated additional gain adjustment stage 54 is an example of one of several ways by which demodulation can be coordinated with the modulation resolution.

Signal integrity during/after gain switching can be achieved in various ways. Upon a gain change by gain adjust block 54, all stages of the demodulator filter can be flushed, as may cause a loss of a reliable signal for the propagation time of the filter, which might not be desirable. For linear filters like the CIC filter 52 (which is a moving average filter), the gain change initiates a counter at bitstream clock frequency. If the total length of all filter stages is N, the filter output during the N cycles following a gain change can be calculated as $S_{out}=\text{gain}_{old}*(N-i)/N+\text{gain}_{new}*(i)/N$ for cycles i from 0 to N. Such a normalization can be implemented in any of the (optional) stages 52, 54, or 56.

An output of the demodulator 24 is coupled to a digital output signal generator 26 with which the digital microcontroller output signal 28 is provided.

Thus, demodulating the digital sensor output signal 30 can include one or more of scaling a number of clock cycles for integration, changing an order of a filter, or scaling a voltage output of the demodulator. More particularly, resolution range adjustment, or scaling can be achieved in the demodulator integrator stage, in which case the number of clock cycles N over which integration is performed can be scaled. For example, if the sensitivity is increased by ten times from the default full scale range, then pulse density from the modulator 60 for a given percentage would be ten times larger. Thus, resetting the integrator window to 0.1× will yield a consistent output. Alternatively, range scaling can be accomplished in filter 52 by changing the filter order and/or input window. Resetting the filter stages after a range adjustment can reduce any lag, or delay incurred, and can reduce sensing error if gain adjustment synchronization between sensor 14 and demodulator 24 is not perfect. Still alternatively, the voltage after the demodulator 24 could be scaled in software, although this approach could incur longer signal delay than other implementations.

Figure 4:
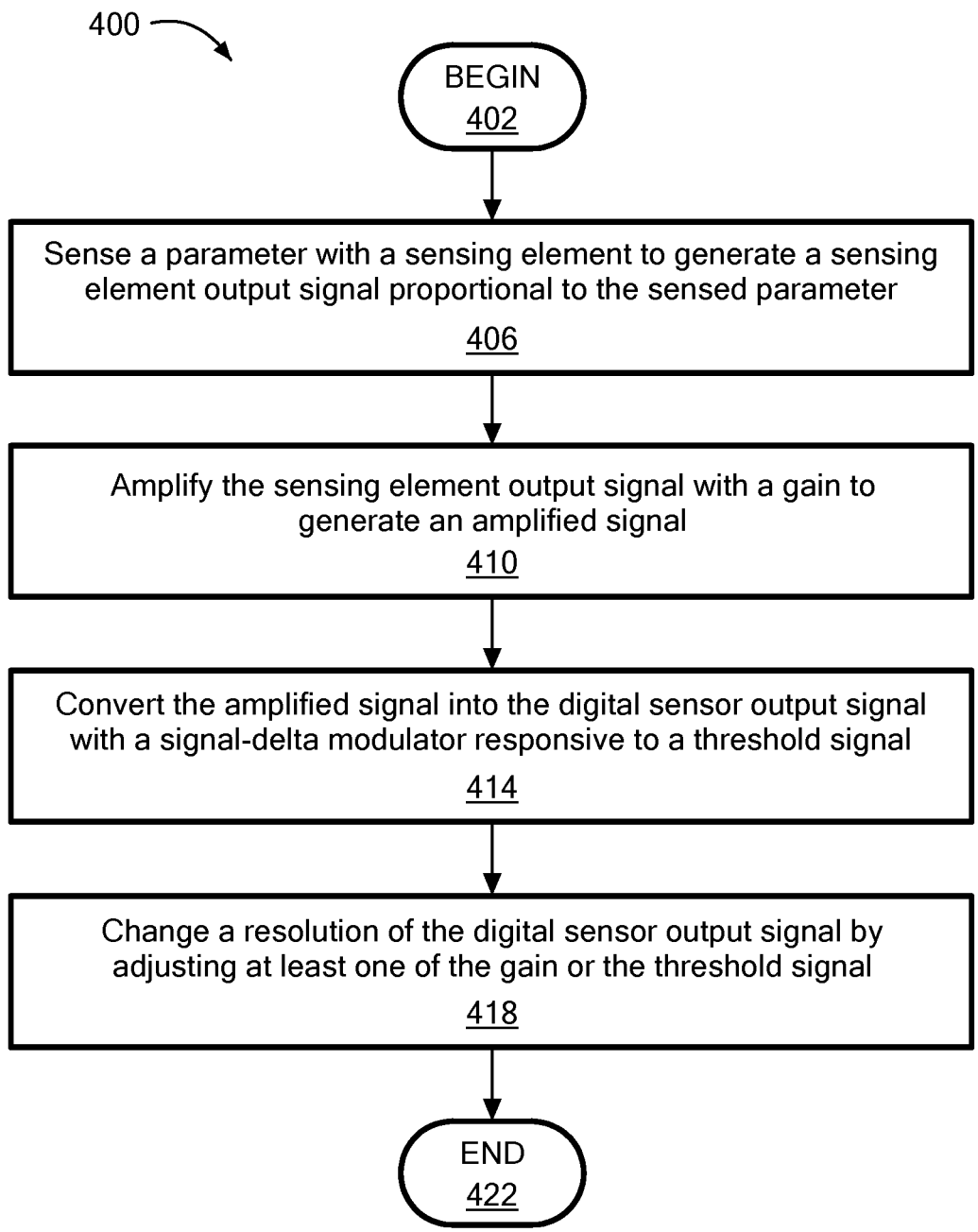
FIG. 4 is a flow diagram illustrating a method for adjusting digital sensor output signal resolution.

Referring also to FIG. 4, a flow diagram illustrates a method for adjusting resolution of a sensor output signal beginning at block 402 according to the disclosure. At block 406, a parameter is sensed with a sensing element to generate a sensing element output signal proportional to the sensed parameter. As a non-limiting example, a magnetic field associated with a target 18 can be sensed by a Hall effect element 40 to generate signal 42 that is proportional to the sensed magnetic field.

At block 410, the sensing element output signal 42 is amplified with a gain to generate an amplified signal. For example, amplifier 52 can amplify sensing element output signal 42 to generate an amplified signal 44.

At block 414, the amplified signal is converted into a digital output signal by a sigma-delta modulator. For example, sigma-delta modulator 60 can convert amplified signal 44 into digital output signal 30. As explained above, modulator is responsive to a threshold 90.

At block 418, resolution of the digital sensor output signal can be changed by adjusting at least one of the gain of the amplifier 52 or the threshold associated with the modulator 60, following which the method ends at block 422. As explained above, such resolution adjustment can be initiated by the sensor 14, the microcontroller 20, or a user through an externally generated input signal and the resolution selection is communicated between the sensor and microcontroller. Further, resolution selection is communicated with the microcontroller 20 so that demodulation can be coordinated with the resolution selection, such as by one or more of scaling a number of clock cycles for integration, changing an order of a filter, or scaling a voltage output of the demodulator.

As used herein, the term "sensor" is used to describe a circuit that uses one or more sensing elements, generally in combination with other circuits. For example, the sensor can be a magnetic field sensor with one or more magnetic field sensing elements. The magnetic field sensor can be, for example, a rotation detector, a movement detector, or a proximity detector. A linear sensor can sense a magnetic field strength. A rotation detector (or movement detector) can senses passing target objects, for example, magnetic domains of a ring magnet or a ferromagnetic target (e.g., gear teeth) where the magnetic field sensor is used in combination with a back-bias or other magnet and can determine target movement speed. Also, linear arrangements of ferromagnetic objects are possible that move linearly.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the terms "processor" and "controller" are used to describe elements that perform a function, an operation, or a sequence of operations. The function, operation, or sequence of operations can be hard coded into an electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a discrete electronic circuit which can be analog or digital, and/or in special purpose logic circuitry (e.g., a field programmable gate array (FPGA)). Processing can be implemented in hardware, software, or a combination of the two. Processing can be implemented using computer programs executed on programmable computers/machines that include one or more processors, a storage medium or other article of manufacture that is readable by the processor (including volatile and non-volatile memory and/or storage elements), at least one input device and one or more output devices. Program code can be applied to data entered using an input device to perform processing and to generate output information. A processor or controller can contain internal processors or modules that perform portions of the function, operation, or sequence of operations. Similarly, a module can contain internal processors or internal modules that perform portions of the function, operation, or sequence of operations of the module.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor integrated circuit configured to generate a digital sensor output signal indicative of a sensed parameter, comprising:
   a sensing element configured to generate a sensing element output signal proportional to the sensed parameter;
   a front-end amplifier coupled to receive the sensing element output signal and configured to generate an amplifier output signal; and
   a sigma-delta modulator coupled to receive the amplifier output signal and configured to generate the digital sensor output signal, wherein at least one of the front-end amplifier or the sigma-delta modulator has an adjustable setting configured to change a resolution of the digital sensor output signal.

2. The sensor integrated circuit of claim 1 wherein the front-end amplifier has an adjustable gain configured to change the resolution of the digital sensor output signal.

3. The sensor integrated circuit of claim 1 wherein the sigma-delta modulator comprises:
   an integrator configured to receive the amplifier output signal and generate an integrated signal;
   a comparator having a first input coupled to receive the integrated signal, a second input coupled to receive a threshold signal, and an output at which a comparator output signal is provided;
   a flip-flop configured to receive the comparator output signal and generate pulses and a feedback signal for coupling to the integrator;
   a clock configured to generate a clock signal to control the flip-flop; and
   a counter configured to count the pulses over a predetermined time period and generate the digital sensor output signal as a pulse stream having a frequency proportional to the sensed parameter.

4. The sensor integrated circuit of claim 3 wherein the threshold signal is adjustable to change the resolution of the digital sensor output signal.

5. The sensor integrated circuit of claim 4 wherein decreasing the threshold signal corresponds to a first dynamic range of the sensed parameter and wherein increasing the threshold signal corresponds to a second dynamic range of the sensed parameter, wherein the first dynamic range is less than the second dynamic range.

6. The sensor integrated circuit of claim 3 wherein the adjustable setting is controlled based on a level of the clock signal.

7. The sensor integrated circuit of claim 1 further comprising an input configured to receive an input signal to control the adjustable setting.

8. The sensor integrated circuit of claim 1 wherein the adjustable setting is controlled based on the sensing element output signal reaching a predetermined signal level.

9. The sensor integrated circuit of claim 7 wherein the digital sensor output signal is coupled to an external controller.

10. The sensor integrated circuit of claim 9 wherein the external controller comprises a demodulator responsive to the adjustable setting.

11. The sensor integrated circuit of claim 1 wherein the sensing element comprises a magnetic field sensing element and the sensed parameter is a magnetic field.

12. A method for generating a digital sensor output signal of a sensor integrated circuit, comprising:
   sensing a parameter with a sensing element to generate a sensing element output signal proportional to the sensed parameter;
   amplifying the sensing element output signal with a gain to generate an amplified signal;
   converting the amplified signal into the digital sensor output signal with a sigma-delta modulator responsive to a threshold signal; and
   changing a resolution of the digital sensor output signal by adjusting at least one of the gain or the threshold signal.

13. The method of claim 12 wherein converting the amplified signal into the digital sensor output signal with the sigma-delta modulator comprises:
   integrating the amplified signal to generate an integrated signal;
   comparing the integrated signal to the threshold signal to generate a comparator output signal;
   receiving the comparator output signal and a clock signal with a flip-flop configured to generate pulses and a feedback signal for coupling to the integrator; and
   counting the pulses over a predetermined time period to generate the digital sensor output signal as a pulse stream having a frequency proportional to the sensed parameter.

14. The method of claim 12 wherein decreasing the threshold signal corresponds to a first dynamic range of the sensed parameter and wherein increasing the threshold signal corresponds to a second dynamic range of the sensed parameter, wherein the first dynamic range is less than the second dynamic range.

15. The method of claim 13 wherein changing the resolution comprises determining a level of the clock signal.

16. The method of claim 12 wherein changing the resolution comprises receiving an input signal to adjust the gain or the threshold signal.

17. The sensor integrated circuit of claim 12 wherein adjusting the gain or the threshold signal is controlled based on the sensing element output signal reaching a predetermined signal level.

18. The method of claim 12 further comprising coupling the digital sensor output signal to an external controller.

19. The method of claim 18 further comprising demodulating the digital sensor output signal with the external controller based on the gain or the threshold signal.

20. The method of claim 19 wherein demodulating the digital sensor output signal comprises one or more of scaling a number of clock cycles for integration, changing an order of a filter, or scaling a voltage output of the demodulator.

21. The method of claim 12 wherein sensing the parameter with a sensing element comprises sensing a magnetic field with a magnetic field sensing element.

* * * * *